US008134406B2

(12) United States Patent
Caplan et al.

(10) Patent No.: US 8,134,406 B2
(45) Date of Patent: Mar. 13, 2012

(54) SYSTEMS AND METHODS FOR MINIMIZING STATIC LEAKAGE OF AN INTEGRATED CIRCUIT

(75) Inventors: Randy J. Caplan, Hoschton, GA (US); Steven J. Schwake, San Jose, CA (US)

(73) Assignee: Mosaid Technologies Incorporated, Ottawa, Ontario (CA)

(*) Notice: Subject to any disclaimer, the term of this patent is extended or adjusted under 35 U.S.C. 154(b) by 0 days.

(21) Appl. No.: 13/158,862

(22) Filed: Jun. 13, 2011

(65) Prior Publication Data

US 2012/0001684 A1 Jan. 5, 2012

Related U.S. Application Data

(60) Continuation of application No. 12/620,749, filed on Nov. 18, 2009, now Pat. No. 7,982,532, which is a division of application No. 11/998,762, filed on Nov. 30, 2007, now Pat. No. 7,642,836, which is a division of application No. 11/900,971, filed on Sep. 14, 2007, now Pat. No. 7,382,178, which is a continuation-in-part of application No. 10/996,739, filed on Nov. 24, 2004, now Pat. No. 7,279,956.

(60) Provisional application No. 60/586,565, filed on Jul. 9, 2004.

(51) Int. Cl.
*G05F 1/10* (2006.01)
(52) U.S. Cl. ........................................ 327/544; 327/534
(58) Field of Classification Search .................. 327/534, 327/535, 536, 537, 544
See application file for complete search history.

(56) References Cited

U.S. PATENT DOCUMENTS

| 5,362,990 | A | 11/1994 | Alvarez et al. |
|---|---|---|---|
| 5,387,882 | A | 2/1995 | Schoofs |
| 5,508,660 | A | 4/1996 | Gersbach et al. |
| 5,781,062 | A | 7/1998 | Mashiko et al. |
| 6,021,056 | A | 2/2000 | Forbes et al. |
| 6,031,778 | A | 2/2000 | Makino et al. |
| 6,034,563 | A | 3/2000 | Mashiko |
| 6,124,755 | A | 9/2000 | Parker et al. |
| 6,160,432 | A | 12/2000 | Rhee et al. |
| 6,198,342 | B1 | 3/2001 | Kawai |
| 6,292,015 | B1 | 9/2001 | Ooishi et al. |
| 6,617,936 | B2 | 9/2003 | Dally et al. |

(Continued)

FOREIGN PATENT DOCUMENTS

EP   0 405 523 A2   1/1991

(Continued)

OTHER PUBLICATIONS

Mutoh, S., et al., "1-V Power Supply High-Speed Digital Circuit Technology with Multithreshold-Voltage CMOS," IEEE J. Of Solid-State Circuits 30(8):847-854, Aug. 1995).

(Continued)

*Primary Examiner* — Jeffrey Zweizig
(74) *Attorney, Agent, or Firm* — Hamilton, Brook, Smith & Reynolds, P.C.

(57) ABSTRACT

A leakage manager system for adequately minimizing static leakage of an integrated circuit is disclosed. The leakage manager system includes a generator configured to generate a control signal to be applied to a sleep transistor. A monitor is configured to determine whether to adjust the control signal to adequately minimize the static leakage. In some embodiments, the monitor includes an emulated sleep transistor. A regulator is configured to adjust the control signal depending on the determination.

23 Claims, 8 Drawing Sheets

U.S. PATENT DOCUMENTS

| | | | |
|---|---|---|---|
| 6,654,296 | B2 | 11/2003 | Jang et al. |
| 6,667,641 | B1 | 12/2003 | Wang et al. |
| 6,741,110 | B2 | 5/2004 | Roisen |
| 6,759,873 | B2 | 7/2004 | Kang et al. |
| 6,781,439 | B2 | 8/2004 | Tanzawa et al. |
| 6,853,253 | B2 | 2/2005 | Desortiaux |
| 6,861,916 | B2 | 3/2005 | Dally et al. |
| 6,924,992 | B2 | 8/2005 | Gaudin et al. |
| 6,954,511 | B2 | 10/2005 | Tachimori |
| 7,051,306 | B2 | 5/2006 | Hoberman et al. |
| 7,053,692 | B2 | 5/2006 | Parris et al. |
| 7,084,697 | B2 | 8/2006 | Kawagoshi |
| 7,092,689 | B1 | 8/2006 | Boecker et al. |
| 2002/0041196 | A1 | 4/2002 | Demone et al. |
| 2002/0149429 | A1 | 10/2002 | Sander |
| 2003/0025130 | A1 | 2/2003 | Takahashi et al. |
| 2003/0038653 | A1 | 2/2003 | Ooishi et al. |
| 2004/0057546 | A1 | 3/2004 | Badets et al. |
| 2004/0066220 | A1 | 4/2004 | Chen |
| 2004/0085106 | A1 | 5/2004 | Jeong |
| 2005/0068076 | A1 | 3/2005 | Iroaga |
| 2005/0195003 | A1 | 9/2005 | Soe |
| 2006/0017476 | A1 | 1/2006 | Jung et al. |
| 2006/0022727 | A1 | 2/2006 | Kim |
| 2007/0018701 | A1 | 1/2007 | Abbasi et al. |
| 2007/0090882 | A1 | 4/2007 | Guenais |

FOREIGN PATENT DOCUMENTS

| | | |
|---|---|---|
| EP | 0 484 059 A2 | 5/1992 |
| EP | 0 755 120 A1 | 1/1997 |
| EP | 1 292 032 A1 | 3/2003 |
| JP | 2000048568 | 2/2000 |
| JP | 2004147175 | 5/2004 |
| WO | WO 01/24364 A1 | 4/2001 |

OTHER PUBLICATIONS

Kawaguchi, H., et al., "A Super Cut-Off CMOS (SCCMOS) Scheme for 0.5-V Supply Voltage with Picoampere Stand-By Current," IEEE J. Of Solid-State Circuits, 35(10):1498-1501 (Oct. 2000).

Inukai, T., et al., "Boosted Gate MOS (BGMOS):Device/Circuit Cooperation Scheme to Achieve Leakage-Free Giga-Scale Integration," Custom Integrated Circuits Conference, 2000. CICC. Proceedings of the IEEE 2000, pp. 409-412.

Kawaguchi, H., et al., "A CMOS Scheme for 0.5-V Supply Voltage with Pico-Ampere Stand-By Current," Solid-State Circuits Conference 1998. Digest of Technical Papers. 45th ISSCC 1998 IEEE International, 5-7, pp. 192-193 (Feb. 1998).

Horiguchi, M., et al., Swtiched-Source-Impedance CMOS Circuit for Low Standby Subthreshold Current Giga-Scale LSI's, IEEE J. of Solid-State Circuits, 28(11):1131-1135, (Nov. 1993).

Nose, K., et al., "VTH-Hopping Scheme to Reduce Subthreshold Leakage for Low-Power Processors," IEEE J. of Solid-State Circuits, 37(3):413-415 (Mar. 2002).

Halter, J. and Najm, F., A Gate-Level Leakage Power Reduction Method for Ultra-Low-Power CMOS Circuits, IEEE Customs Integrated Circuits Conference, pp. 475-478 (1997).

Kao, J. and Chandrakasan, A., Dual-Threshold Voltage Techniques for Low-Power Digital Circuits,: IEEE J. of Solid-State Circuits, 35(7):1009-1018, (Jul. 2000).

Lackey, D., et al., "Managing Power and Performance for System-on-Chip Designs using Voltage Islands," Computer Aided Design, 2002 pp. 195-202. ICCAD 2002, IEEE/ACM International Conference (Nov. 10-14, 2002).

Das, K. and Brown, R., Ultra Low-Leakage Power Strategies for Sub1 V VLSI: Novel Circuit Styles and Design Methodologies for Partially Depleted Silicon-On-Insulator (PD-SOI) CMOS Technology, 16th International Conference on VLSI Design, pp. 291-296 (2003).

Calhoun, B., "A Leakage Reduction Methodology for Distributed MTCMOS," IEEE J. of Solid-State Circuits 39(5):818-826 (May 2004).

Duque-Carrillo, J.F., et al., "1-V Rail-to-Rail Operational Amplifiers in Standard CMOS Technology," IEEE J. of Solid-State Circuits, 35(1):33-44, (Jan. 2000).

Kim, C.H., et al., "A 64-Mbit, 640-Mbyte/s bidirectional Data Strobed, Double-Data-Rate SDRAM with a 40-mW DLL for a 256-Mbyte Memory System," IEEE J. of Solid-State Circuits, 33(11):1703-1710, (Nov. 1998).

Larsson, P., A 2-1600MHz 1.2-2.5V CMOS Clock-Recovery PL with Feedback Phase-Selection and Averaging Phase-Interpolation for Jitter Reduction, IEEE J. of Solid-State Circuits Conference 1999.

Maneatis, J.G., "Low-Jitter Process-Independent DLL and PLL Based on Self-Biased Techniques," IEEEE J. of Solid-State Circuits, 31(11):1723-1732, (Nov. 1996).

Moon, Y., et al., "An All-Analog Multiphase Delay-Locked Loop Using a Replica Delay Line for Wide-Range Operation and Low-Jitter Performance," IEEE J. of Solid-State Circuits, 35(3):377-384, (Mar. 2000).

Samavati, et al., A Fully-Integrated 5 GHz CMOS Wireless-LAN Receiver, IEEE International Solid-State Circuits Conference 2001.

International Search Report of Application No. PCT/US05/23839, mailed on Nov. 22, 2006.

Supplementary European Search Report for European Patent Application No. EP 05 78 0186, completed on Jun. 18, 2009 and mailed on Jun. 24, 2009.

SYSTEMS AND METHODS FOR MINIMIZING STATIC LEAKAGE OF AN INTEGRATED CIRCUIT

RELATED APPLICATIONS

This application is a Continuation of U.S. application Ser. No. 12/620,749, filed Nov. 18, 2009, now U.S. Pat. No. 7,982,532 which is a Divisional of U.S. application Ser. No. 11/998,762, filed Nov. 30, 2007 (now U.S. Pat. No. 7,642,836), which is a Divisional of U.S. application Ser. No. 11/900,971, filed Sep. 14, 2007 (now U.S. Pat. No. 7,382,178), which is a Continuation-in-Part of U.S. application Ser. No. 10/996,739, filed Nov. 24, 2004 (now U.S. Pat. No. 7,279,956), which claims the benefit of U.S. Provisional Application No. 60/586,565, filed Jul. 9, 2004. This application is also related to U.S. application Ser. No. 10/840,893, filed May 7, 2004 (now U.S. Pat. No. 7,051,306).

The entire teachings of the above applications are incorporated herein by reference.

BACKGROUND OF THE INVENTION

One design goal for integrated circuits is to reduce power consumption. Devices with batteries such as cell phones and laptops particularly need a reduction in power consumption in the integrated circuit to extend the life of the battery. Additionally, a reduction in power consumption prevents overheating and lowers the heat dissipation of the integrated circuit, which in some cases eliminates or simplifies heat sinks and/or fans required to cool the integrated circuit. As well, the reduction in power consumption of the integrated circuit reduces the AC power draw for the device containing the integrated circuit.

A competing design goal for integrated circuits is increased performance. One way to increase performance is by increasing a maximum operating frequency of a circuit. In order to increase the maximum operating frequency of a circuit, or to integrate more functionality in a smaller area, integrated circuit manufacturing technology shrinks the device size of individual components (e.g. transistors) on the integrated circuit.

However, as component device size scales from 250 nanometers to 130 nanometers or below, a current draw of a device in standby mode referred to as static leakage becomes an increasingly large part of the power budget of the integrated circuit. For example, simulations show that, for an integrated circuit dissipating 50 watts constructed using 130 nanometer devices, greater than 20 percent of the power dissipated is due to static leakage. For even smaller devices, simulations show that the static leakage of an integrated circuit using 50 nanometer feature sizes comprises about 50 percent of the total power budget.

One solution for reducing static leakage includes use of one or more sleep transistors coupled to a logic gate of the integrated circuit. Application of a control signal to the sleep transistor may reduce the static leakage of the logic gate.

SUMMARY OF THE INVENTION

A system for minimizing static leakage of an integrated circuit comprises a charge pump, an adaptive leakage controller, and a negative voltage regulator. The charge pump generates a negative voltage to be applied to a sleep transistor. The sleep transistor is configured to control the static leakage of a logic gate of the integrated circuit. In some embodiments, the logic gate may be located in a power island of the integrated circuit. The adaptive leakage controller determines whether to adjust the negative voltage to minimize the static leakage. The adaptive leakage controller may continuously or periodically determine whether to adjust the negative voltage. The negative voltage regulator adjusts the negative voltage depending on the determination.

A method for minimizing static leakage of the integrated circuit comprises generating the negative voltage, applying the negative voltage to the sleep transistor, determining whether to adjust the negative voltage to minimize the static leakage, and adjusting the negative voltage depending on the determination. The method may comprise controlling static leakage of the logic gate of the integrated circuit with the sleep transistor. The method may comprise monitoring one or more parameters of the sleep transistor.

In at least one example embodiment, the adaptive leakage controller determines whether to adjust the negative voltage, and therefore static leakage is minimized with changes in operating temperature of the integrated circuit, or with voltage fluctuations or manufacturing variations. Rather than a fixed negative voltage, the negative voltage applied to the sleep transistor is adjusted to minimize the static leakage. A further advantage is that single threshold transistor circuitry may be utilized in the integrated circuit, reducing the complexity of the manufacturing process for the integrated circuit. A still further advantage is that the negative voltage may be generated within the integrated circuit, obviating components external to the integrated circuit for generating the negative voltage.

According to one example embodiment, there is an integrated circuit that includes two power supply terminals for powering the integrated circuit. The power supply terminals include a $V_{dd}$ positive supply terminal and a $V_{ss}$ ground terminal together defining a range of logic levels. The integrated circuit also includes logic components. Each of the logic components is a selected one of a logic gate and a storage cell, and each of the logic components includes a sleep transistor in series with each electrical connection to one of the power supply terminals. A voltage generator generates a voltage outside the range of logic levels. The integrated circuit also includes circuitry for applying the voltage outside the range of logic levels to the sleep transistor during a power down mode. In a mode other than power down mode, the circuitry may apply $V_{dd}$ to the sleep transistor. Alternatively, the circuitry may apply a voltage greater than $V_{dd}$ to the sleep transistor when in a mode other than power down mode. The integrated circuit also includes a voltage regulator for controlling the voltage generator to adequately minimize leakage current through the sleep transistor during the power down mode.

According to one example embodiment, there is an integrated circuit that includes two power supply terminals for powering the integrated circuit. The power supply terminals include a $V_{dd}$ positive supply terminal and a $V_{ss}$ ground terminal. The integrated circuit also includes logic components. Each of the logic components is a selected one of a logic gate and a storage cell, and each of the logic components includes a sleep transistor in series with each electrical connection to one of the power supply terminals. A charge pump generates a negative voltage. The integrated circuit also includes circuitry for applying the negative voltage to the sleep transistor during a power down mode. The integrated circuit also includes a voltage regulator for controlling the charge pump to adequately minimize leakage current through the sleep transistor during the power down mode.

According to yet another example embodiment, there is a leakage manager system for adequately minimizing static leakage of an integrated circuit. The leakage manager system includes a generator configured to generate a control signal to be applied to a sleep transistor. A monitor is configured to determine whether to adjust the control signal to adequately minimize the static leakage. The monitor includes an emulated sleep transistor. A regulator is configured to adjust the control signal depending on the determination.

According to yet another example embodiment, there is a method for adequately minimizing static leakage of an integrated circuit having logic components. Each of the logic components is a selected one of a logic gate and a storage cell, and each of the logic components includes a sleep transistor in series with each electrical connection to a $V_{ss}$ ground terminal. The method includes generating a negative voltage to be applied to the sleep transistor. The method also includes determining whether to adjust the negative voltage to adequately minimize the static leakage. The method also includes adjusting the negative voltage depending on the determination.

According to yet another example embodiment, there is an adaptive leakage controller for adequately minimizing a static leakage of an integrated circuit. A capacitor is configured to be charged to a positive supply voltage. A transistor is configured to discharge the capacitor at a rate in proportion to the static leakage. A control circuit is configured to determine whether to adjust a negative voltage applied to a sleep transistor configured to control the static leakage based on a minimum rate of discharge of the capacitor.

According to yet another example embodiment, there is a method for adequately minimizing static leakage of an integrated circuit. The method includes charging a capacitor to a positive supply voltage, and also discharging the capacitor at a rate in proportion to the static leakage. The method also includes adjusting a negative voltage applied to a gate of a sleep transistor to adequately minimize the rate of discharge of the capacitor.

According to yet another example embodiment, there is a power management method carried out in an integrated circuit having logic components, a $V_{dd}$ positive supply terminal and a $V_{ss}$ ground terminal. Each of the logic components includes a sleep transistor in series with each electrical connection to one of the terminals. The $V_{dd}$ positive supply terminal and the $V_{ss}$ ground terminal define a range of logic levels. The method includes generating a voltage outside the range of logic levels, and also applying the generated voltage outside the range of logic levels to the sleep transistor during a power down mode. The method also includes adjusting the generated voltage to adequately minimize leakage current through the sleep transistor during the power down mode.

DETAILED DESCRIPTION OF THE INVENTION

As shown in the exemplary drawings wherein like reference numerals indicate like or corresponding elements among the figures, example embodiments of a system and method according to the present invention are described below in detail. It is to be understood, however, that the present invention may be embodied in various forms. For example, although described herein as pertaining to minimizing static leakage of an integrated circuit, aspects of the invention may be practiced on circuitry not embodied within an integrated circuit. Therefore, specific details disclosed herein are not to be interpreted as limiting, but rather as a basis for the claims and as a representative basis for teaching one skilled in the art to employ the present invention in virtually any appropriately detailed system, structure, method, process or manner.

Figure 1:
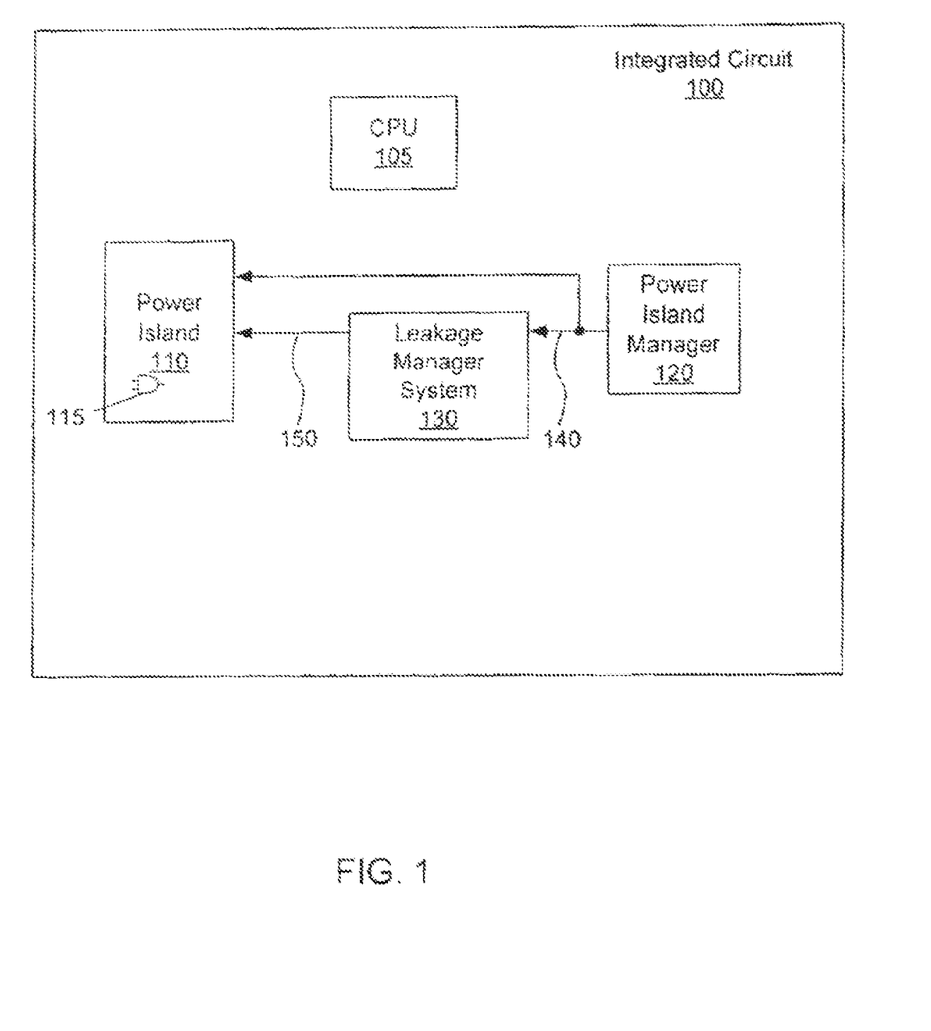
FIG. 1 is a block diagram of an integrated circuit embodying a system for minimizing static leakage, in accordance with an example embodiment.

FIG. 1 is a block diagram of an integrated circuit 100 embodying a system for minimizing static leakage, in accordance with an example embodiment. The integrated circuit 100 is any electronic device that is instantiated into silicon and/or similar manufacturing materials. One example of the integrated circuit 100 is a system-on-a-chip. The integrated circuit 100 includes multiple intellectual property (IP) units, which are blocks of circuitry performing specific functions. It will be appreciated that functions of the integrated circuit 100 described herein may be performed by a single integrated circuit 100 or may be partitioned among several integrated circuits 100. The exemplary integrated circuit 100 of FIG. 1 includes a central processor unit (CPU) 105, one or more power islands 110, one or more power island managers 120, and one or more leakage manager systems 130.

While FIG. 1 depicts one power island 110 and one power island manager 120 for the sake of simplicity, other embodiments of the integrated circuit 100 may include any number of power islands 110, power island managers 120, and leakage manager systems 130. In such embodiments, some of the power islands 110 may comprise different circuitry with respect to other power islands 110. The power island 110 and the power island manager 120 are further described in co-pending U.S. patent application Ser. No. 10/840,893, entitled "Managing Power on Integrated Circuits Using Power Islands," filed May 7, 2004.

The power island 110 is any section, delineation, partition, or division of the integrated circuit 100 in which power consumption is controlled. In some embodiments, multiple power islands 110 are delineated based on geographical factors of the integrated circuit 100. In some embodiments, multiple power islands 110 are delineated based on functional IP units of the integrated circuit 100. In some embodiments, the power island 110 comprises sub-islands of power to provide further specificity in controlling power in the integrated circuit 100. In some embodiments, each of multiple power islands 110 includes power control circuitry to control power within the power island 110.

The power island manager 120 is any circuitry, device, or system to determine a target power level for one of the power islands 110, determine an action to change a consumption power level of the one of the power islands 110 to the target power level, and perform the action to change the consumption power level of the one of the power islands 110 to the target power level. The power island manager 120 can thus dynamically change the power consumption of the power islands 110 based on the needs and operation of the integrated circuit 100. The target power level is a desired, calculated, or specified power consumption of the power islands 110. The power island manager 120 may be a hierarchy or group of power island managers 120.

While FIG. 1 depicts one leakage manager system 130 coupled to one power island manager 120 for the sake of simplicity, some embodiments comprise a plurality of leakage manager systems 130. In certain embodiments including a plurality of leakage manager systems 130, each of the leakage manager systems 130 is coupled to one of a plurality of power island managers 120. In some embodiments, functions of the leakage manager system 130 are distributed. In some embodiments, a single leakage manager system 130 is coupled to one or more power island managers 120. It will be appreciated that principles of the invention may apply to a circuit without power islands 110 or power island managers 120.

The power island 110 includes one or more logic gates 115. In an embodiment without the power island 110, the logic gate 115 may comprise any logic gate of the integrated circuit 100. The logic gate 115 of the exemplary embodiment comprises any logic circuitry such as an inverter, a NAND, NOR, exclusive-OR, and exclusive-NOR gate, as well as a storage cells such as a flip-flop and a latch. The logic gate 115 may comprise higher-level Boolean logic, including combinations of individual logic gates.

The logic gate 115 may be powered down to a "sleep mode" in conjunction with a sleep transistor (not shown), as described further herein. To minimize static leakage of the logic gate 115, the leakage manager system 130 generates a negative voltage 150 to be applied to the sleep transistor. Applying the negative voltage 150 to a gate of an NMOS sleep transistor coupled between the logic gate 115 and ground may reduce the static leakage of the logic gate 115. The leakage manager system 130 receives a negative voltage enable signal 140 and subsequently generates and transmits the negative voltage 150 to the power island 110. The negative voltage enable signal 140 may include other signals in addition to the negative voltage enable signal 140. The leakage manager system 130 determines whether to adjust the negative voltage 150. Based on the determination, the leakage manager system 130 adjusts the negative voltage 150, as described further herein.

Adjusting the negative voltage 150 applied to the sleep transistor minimizes static leakage of the logic gate 115. For example, static leakage varies based on parameters such as operating temperature, voltage fluctuations, and manufacturing variations. Therefore, application of a fixed negative voltage to the sleep transistor does not optimally minimize the static leakage of the logic gate 115. Furthermore, generating the negative voltage 150 "on chip" reduces component requirements external to the integrated circuit 100.

An alternative to reduce the static leakage of the logic gate 115 comprises multiple threshold voltage CMOS, in which one or more high threshold transistors are inserted in series with a low threshold logic gate 115. Switching the high threshold transistor "off" reduces the static leakage of the logic gate 115. However, the high threshold transistor requires extra manufacturing process steps for the integrated circuit 100 and slows down the speed of the logic gate 115 as compared to nominal threshold transistors. Providing the negative voltage 150 to a low threshold NMOS sleep transistor advantageously eliminates a requirement to provide high threshold sleep transistor, thereby reducing processing steps needed to manufacture the integrated circuit 100.

Figure 2:
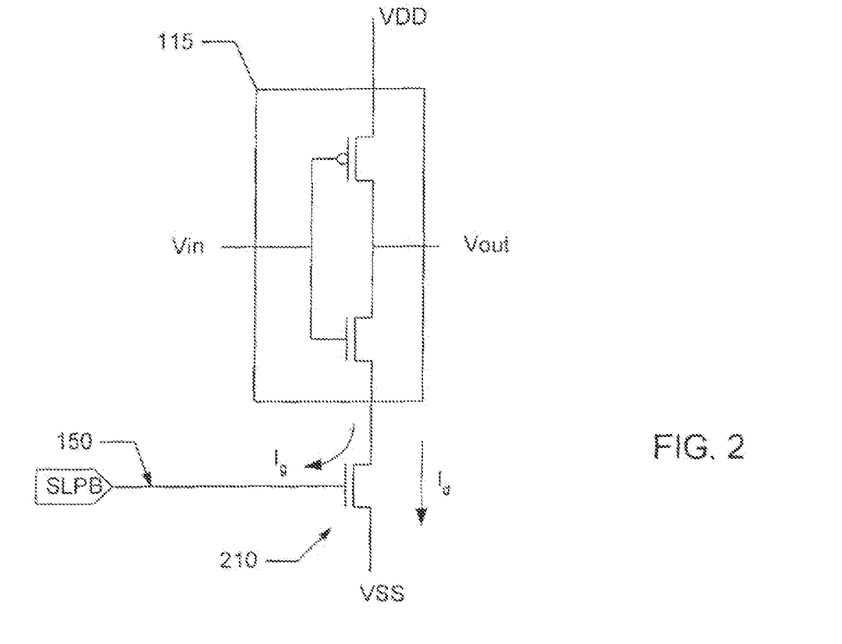
FIG. 2 is an illustration of a sleep transistor for minimizing static leakage of the logic gate of FIG. 1, in accordance with an example embodiment.

FIG. 2 is an illustration of a sleep transistor 210 for minimizing static leakage of the logic gate 115 of FIG. 1, in accordance with an example embodiment. In some embodiments, the sleep transistor 210 comprises an NMOS transistor cascaded in series with the logic gate (e.g., inverter) 115. Static leakage of the logic gate 115 passes through the sleep transistor 210 as a drain-source current (depicted as $I_d$) and/or as a drain-gate current (depicted as $I_g$). The static leakage of the logic gate 115 equals $I_d+I_g$ through the sleep transistor 210. The negative voltage (SLPB) 150 applied to the sleep transistor 210 may be used to control the static leakage of the logic gate 115 by regulating the drain-source current and the drain-gate current of the sleep transistor 210.

Figure 3:
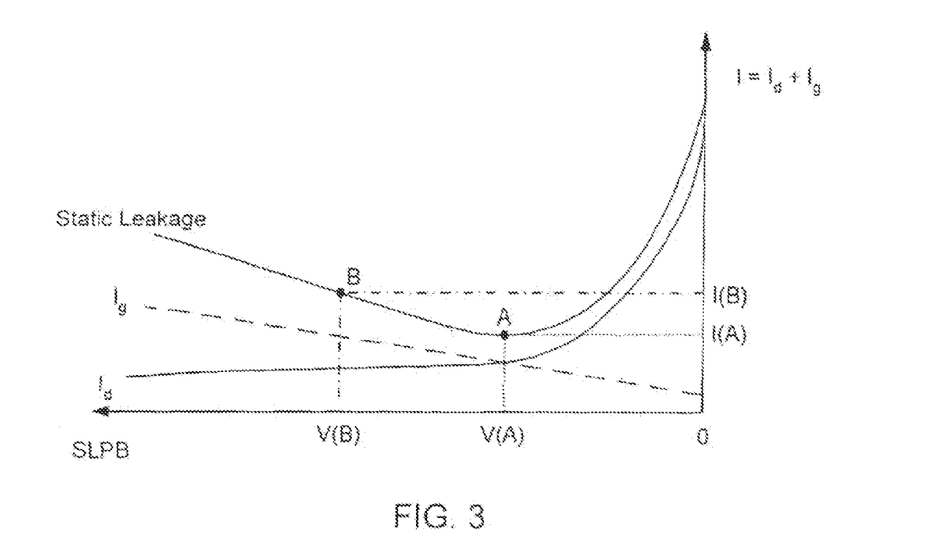
FIG. 3 is an illustration of a graph of static leakage of the logic gate of FIG. 2, for a range of negative voltage at the gate of the sleep transistor, in accordance with an example embodiment.

FIG. 3 is an illustration of a graph of static leakage of the logic gate 115 of FIG. 2, for a range of negative voltage at the gate of the sleep transistor 210, in accordance with an example embodiment. As the negative voltage (SLPB) 150 applied to the gate of the sleep transistor 210 becomes increasingly negative, the drain-source current $I_d$ of the sleep transistor 210 decreases. However, as the magnitude of the negative voltage 150 increases beyond a minimum leakage point A, for example to point B, the drain-gate current $I_g$ of the sleep transistor 210 exceeds the drain-source current $I_d$. As a result, the static leakage of the logic gate 115 increases. Accordingly, adjusting the negative voltage 150 to approximately V(A), corresponding to a substantial equality between the drain-source current $I_d$ and the drain-gate current $I_g$ at the minimum leakage point A, minimizes static leakage in the logic gate 115.

Figure 4:
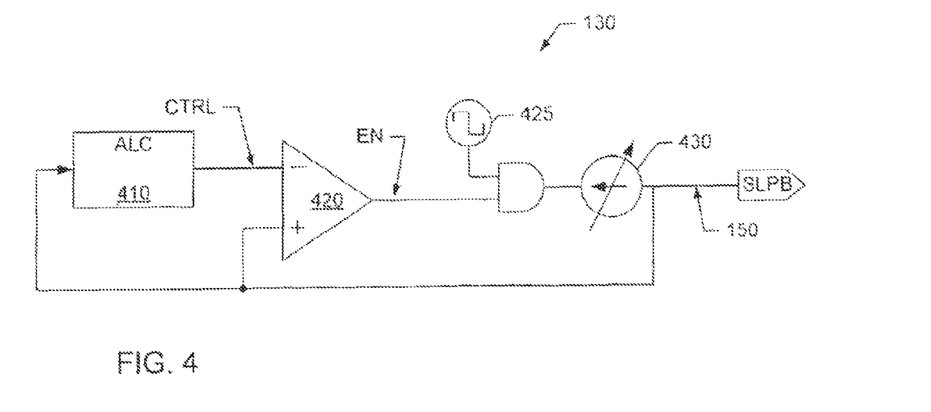
FIG. 4 is a block diagram of the leakage manager system for minimizing static leakage of the logic gate by application of the negative voltage of to the sleep transistor of FIG. 2, in accordance with an example embodiment.

FIG. 4 is a block diagram of the leakage manager system 130 for minimizing static leakage of the logic gate 115 by application of the negative voltage of to the sleep transistor 210 of FIG. 2, in accordance with an example embodiment. The leakage manager system 130 comprises an adaptive leakage controller (ALC) 410, a negative voltage regulator 420, and a charge pump 430. The charge pump 430 generates the negative voltage 150 (SLPB). The ALC 410 determines whether to adjust the negative voltage 150. The ALC 410 generates a signal (depicted as CTRL) depending on the determination. The negative voltage regulator 420 adjusts the negative voltage 150 depending on the CTRL signal.

As described further herein, the negative voltage regulator 420 of one embodiment generates an enable (EN) signal to the charge pump 430 to enable the charge pump 430 to increase the magnitude of the negative voltage 150 (i.e., to make the negative voltage 150 more negative). If the EN signal is low, an alternating signal from an oscillator 425 to the charge pump 430 is disabled, preventing the charge pump 430 from increasing the magnitude of the negative voltage 150. Alternatively, if the EN signal is high, the alternating signal from the oscillator 425 is enabled so that the charge pump 430 will increase the magnitude of the negative voltage 150. Because the negative voltage regulator 420 toggles the EN signal on or off depending on whether the ALC 410 determines to adjust the negative voltage 150, the leakage manager system 130 maintains the negative voltage 150 at a particular negative voltage to minimize static leakage of the logic gate 115.

Figure 5:
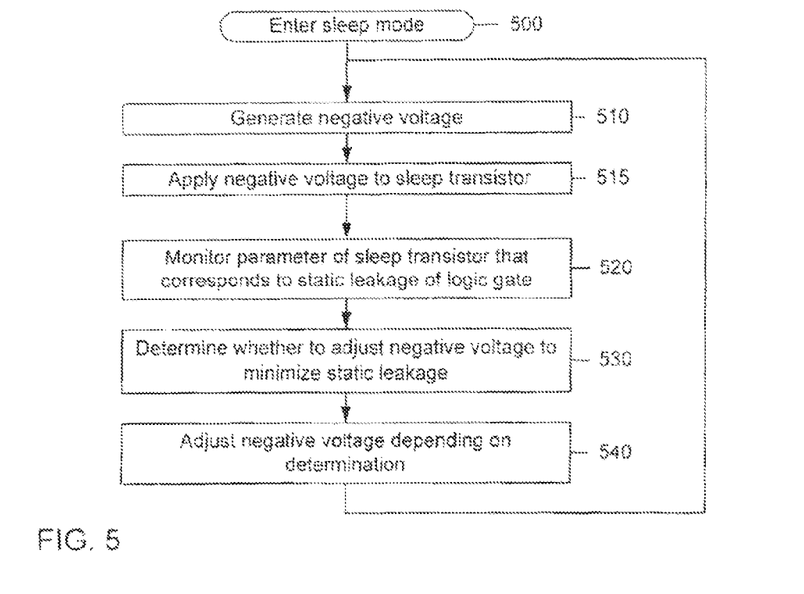
FIG. 5 is an illustration of a method to minimize the static leakage of the logic gate of FIG. 2, in accordance with an example embodiment.

FIG. 5 is an illustration of a method to minimize the static leakage of the logic gate 115 of FIG. 2, in accordance with an example embodiment. At step 500, the CPU 105 (FIG. 1) enters sleep mode. At step 510, the charge pump 430 (FIG. 4) generates the negative voltage 150. At step 515, the charge pump 430 applies the negative voltage 150 to the sleep transistor 210 (FIG. 2). At step 520, the ALC 410 (FIG. 4) may monitor one or more parameters of the sleep transistor 210 corresponding to the static leakage of the logic gate 115. The ALC 410 may monitor the sleep transistor 210 directly, or may monitor one or more emulated sleep transistors, as described further with respect to FIGS. 6-8.

At step 530, the ALC 410 determines whether to adjust the negative voltage 150 to minimize static leakage. If the ALC 410 determines to adjust the negative voltage 150, the ALC 410 generates the CTRL signal to the negative voltage regulator 420 (FIG. 4). At step 540, the negative voltage regulator 420 adjusts the negative voltage 150 based on the CTRL signal.

In one embodiment, the negative voltage regulator 420 continuously adjusts the negative voltage 150. In another embodiment, the negative voltage regulator 420 periodically adjusts the negative voltage 150.

The leakage manager system 130 adjusts the negative voltage 150 to minimize the static leakage of the logic gate 115, even if the static leakage varies due to effects such as temperature variation, voltage fluctuation, or manufacturing process variation. The leakage manager system 130 may advantageously be wholly integrated into the integrated circuit 100, obviating components external to the integrated circuit 100 to generate the negative voltage 150. Further, the leakage manager system 130 may advantageously be utilized in the integrated circuit 100 comprising single threshold transistor logic, so that manufacturing of the integrated circuit 100 is simplified.

FIGS. 6-10 illustrate further detail of embodiments of the leakage manager system 130 of FIG. 4.

Figure 6:
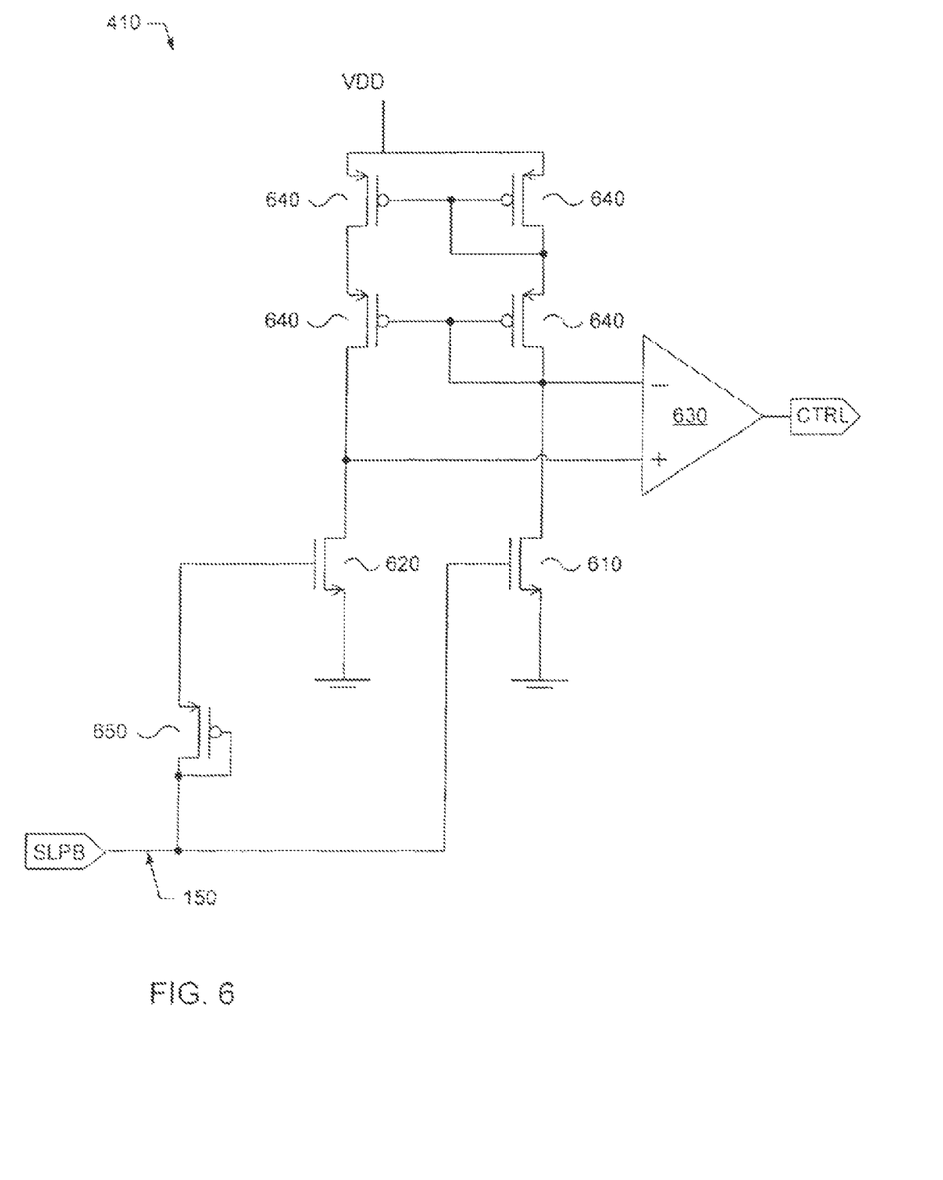
FIG. 6 is an illustration of the adaptive leakage controller (ALC) of FIG. 4, in accordance with an example embodiment.

FIG. 6 is an illustration of the adaptive leakage controller (ALC) 410 of FIG. 4, in accordance with an example embodiment. The ALC 410 of this embodiment comprises a first emulated sleep transistor 610, a second emulated sleep transistor 620, a differential (operational) amplifier 630, bias transistors 640, and a voltage offset transistor 650. It will be appreciated that the ALC 410 of this embodiment comprises analog circuitry to continuously determine whether to adjust the negative voltage 150 of FIG. 4.

It will also be appreciated that although FIG. 6 depicts the bias transistors 640 as PMOS transistors with gate connected to drain to provide a resistive voltage drop across the bias transistors 640, the bias transistors 640 may comprise resistors. In the exemplary embodiment with PMOS bias transistors 640, matching between the several bias transistors 640 ensures substantially identical operation of the bias transistors 640. The voltage offset transistor 650 of the exemplary embodiment similarly comprises a PMOS transistor with gate connected to drain to provide a resistive voltage drop across the voltage offset transistor 650. Alternatively, the voltage offset transistor 650 may comprise a resistor.

In FIG. 6, the negative voltage 150 (SLPB) is applied to a gate of the first emulated sleep transistor 610. The negative voltage 150 correspondingly produces a first current through the first emulated sleep transistor 610. The first current may comprise drain-gate current and/or drain-source current. The first current through the first emulated sleep transistor 610 is in proportion to the static leakage of the logic gate 115. The first current creates a first voltage drop across the bias transistors (resistances) 640 at a drain of the first emulated sleep transistor 610. The first voltage drop is sensed at a negative input of the differential amplifier 630.

With respect to the second emulated sleep transistor 620, the resistance of the voltage offset transistor 650 reduces the magnitude of the negative voltage 150 (SLPB) by a voltage offset. A gate of the second emulated sleep transistor 620 receives the negative voltage 150 plus the voltage offset. The negative voltage 150 plus the voltage offset produces a second current through the second emulated sleep transistor 620. The second current may comprise drain-gate current and/or drain-source current. The second current creates a second voltage drop across the bias transistors (resistors) 640 at a drain of the second emulated sleep transistor 620. The second voltage drop is sensed at a positive input of the differential amplifier 630.

In operation, the gate of the second emulated sleep transistor 620 operates at a slight voltage offset as compared to the gate of the first emulated sleep transistor 610, because of the voltage offset transistor 650. Referring to FIG. 3, the voltage offset may be represented by the voltage offset between points A and B, or V(B)-V(A). As a result of the voltage offset, the minimum leakage point A may be detected by adjusting the negative voltage 150 so that I(B) is substantially equal to I(A). It will be appreciated that operating parameters of the voltage offset transistor 650 influence the magnitude of the voltage offset. The operating parameters may be based on such considerations as noise on the negative voltage 150, for example.

In principle of operation with respect to FIG. 3, if the magnitude of the negative voltage 150 produces a first current I(B) in the first emulated sleep transistor 610 corresponding to point B, and the negative voltage 150 plus the voltage offset produces a second current I(A) in the second emulated sleep transistor 620 corresponding to point A, then the differential amplifier 630 will generate the CTRL signal so that the magnitude of the negative voltage 150 will be adjusted until I(A) substantially equals I(B). Alternatively, if the negative voltage 150 is such that the first emulated sleep transistor 610 and the second emulated sleep transistor 620 produce substantially equal currents, so that I(A)=I(B), then the differential amplifier 630 will maintain the present value of the CTRL signal. The resulting operating point will be a negative voltage which is offset from the ideal operating point by a value equal to one half the voltage offset produced by the current though the voltage offset transistor 650. If gate leakage is negligible, there may be no inflection in the leakage vs. gate voltage curve of FIG. 3. In this case, the CTRL signal will decrease to its minimum value, causing the charge pump 430 (FIG. 4) to operate at its most negative voltage.

Figure 9:
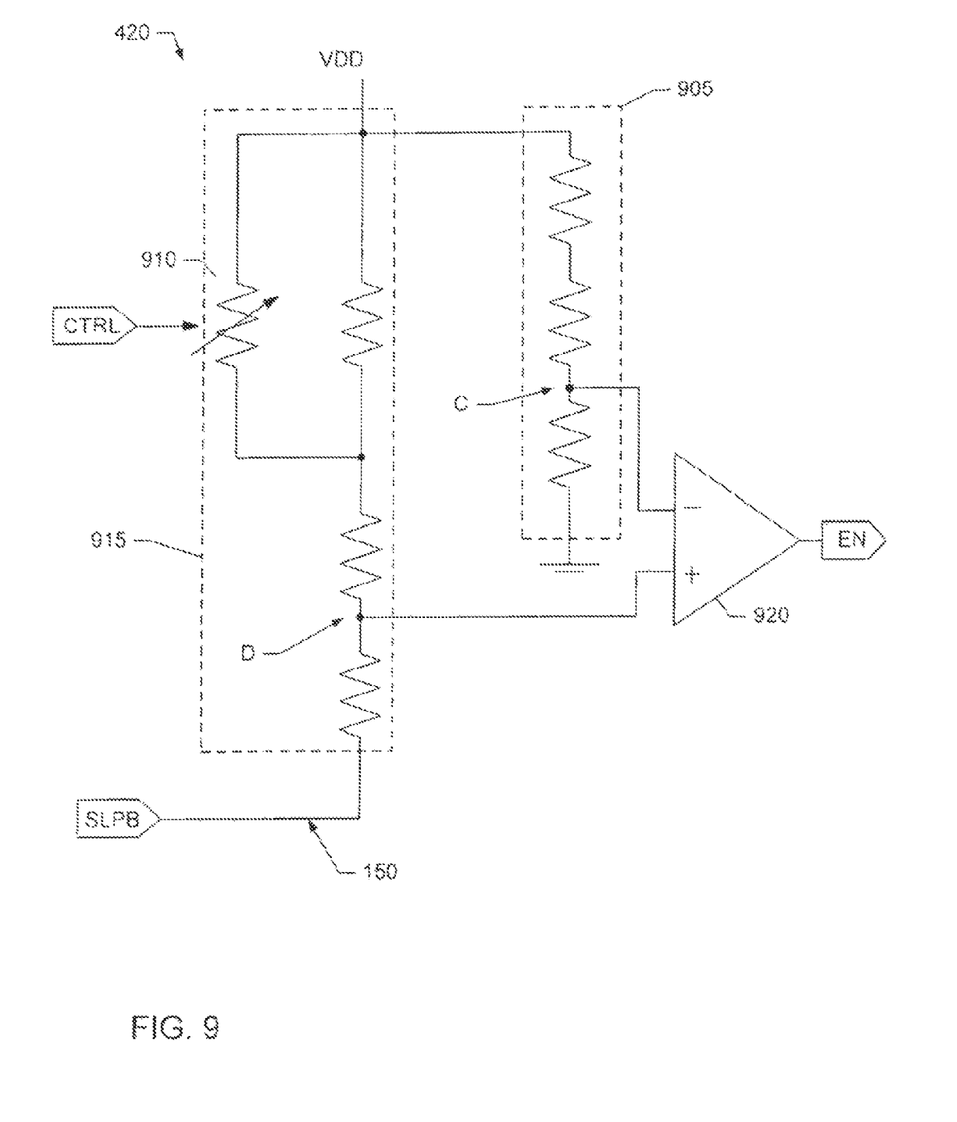
FIG. 9 is an illustration of the negative voltage regulator of FIG. 4 for minimizing static leakage of the logic gate, in accordance with an example embodiment.

In conjunction with the negative voltage regulator 420 of FIG. 9, the ALC 410 of this embodiment advantageously minimizes static leakage of the logic gate 115 by continuously controlling the negative voltage 150 to approximately the minimum leakage point A of FIG. 3.

Figure 7:
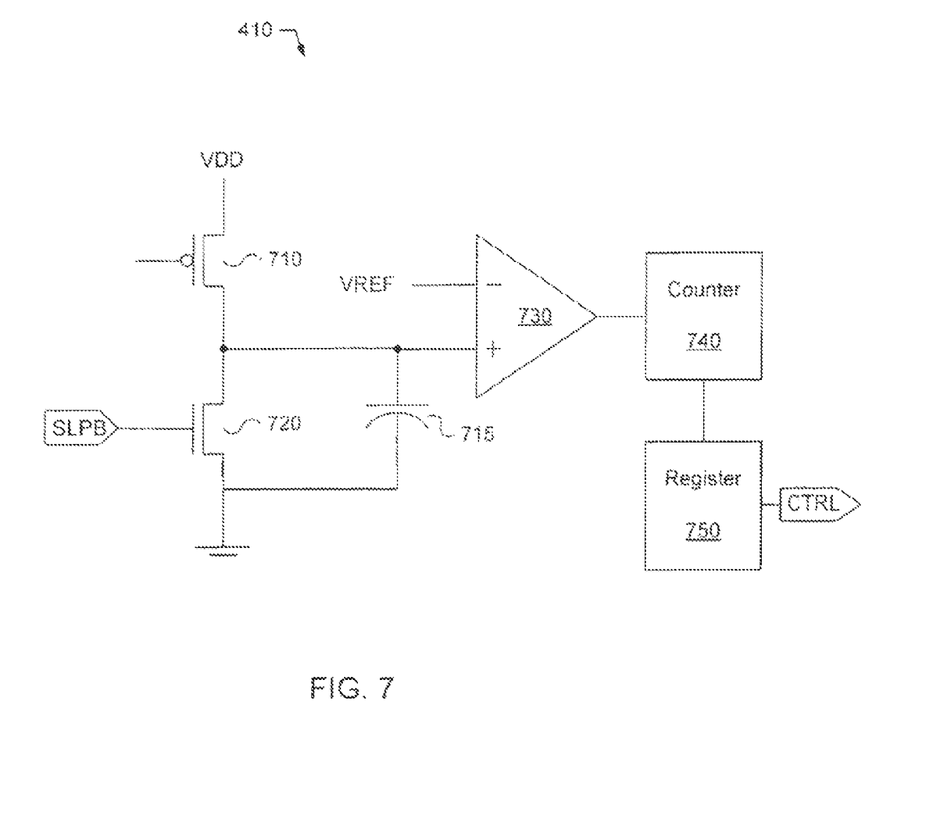
FIG. 7 is an illustration of the ALC of FIG. 4, in accordance with an alternative example embodiment.

FIG. 7 is an illustration of the ALC 410 of FIG. 4, in accordance with an alternative example embodiment. The ALC 410 of this embodiment comprises a charging transistor 710, a capacitor 715, an emulated sleep transistor 720, a comparator 730, a counter 740, and a register 750. The charging transistor 710 is switched by a controller (not shown) to charge the capacitor 715 to a positive supply voltage (e.g., $V_{DD}$). The controller may also switch the charging transistor 710 so that the capacitor 715, once charged, may discharge through the emulated sleep transistor 720. The comparator 730, the counter 740, and the register 750 comprise a control circuit to measure a time needed to discharge the capacitor 715 to a predetermined value VREF. A state logic machine (not shown) coupled to the register 750 may compare values stored in the register 750, as described with respect to FIG. 8.

In this embodiment of the ALC 410, the maximum discharge time for the capacitor 715 corresponding to the lowest value of static leakage is used to generate a digital value for the CTRL signal to the negative voltage regulator 420 (FIG. 4). The ALC 410 periodically updates the CTRL signal if the ALC 410 determines to adjust the negative voltage 150. The operation of the ALC 410 of this embodiment is described with respect to FIG. 8.

Figure 8:
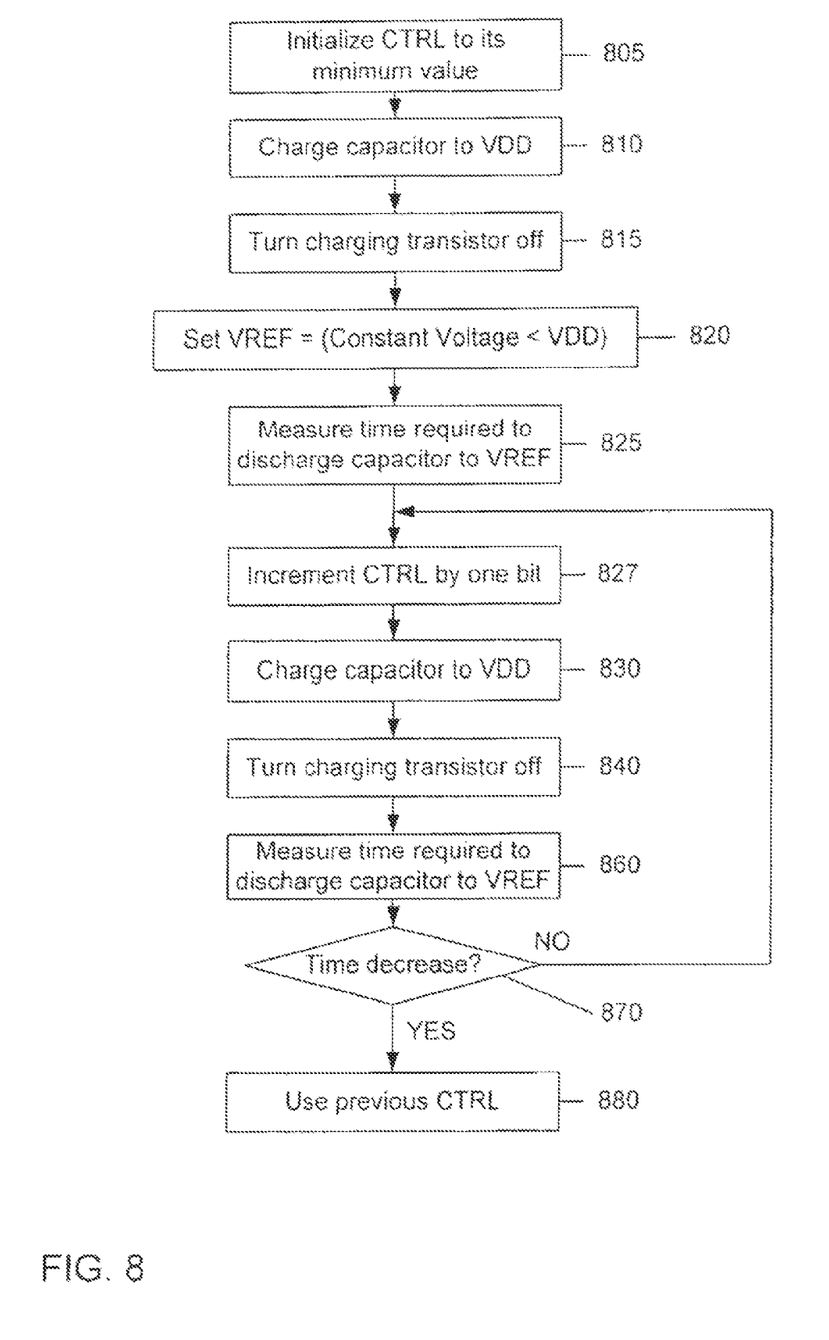
FIG. 8 is an illustration of a method for minimizing static leakage of the logic gate of FIG. 2, in accordance with the embodiment of the ALC of FIG. 7.

FIG. 8 is an illustration of a method for minimizing static leakage of the logic gate 115 of FIG. 2, in accordance with the embodiment of the ALC 410 of FIG. 7. In overview, the method comprises charging the capacitor 715 to the positive supply voltage $V_{DD}$, discharging the capacitor at a rate in proportion to the static leakage of the logic gate 115 via the emulated sleep transistor 720, and adjusting the negative voltage 150 to minimize the rate of discharge of the capacitor 715. The negative voltage 150 that corresponds to minimum current through the emulated sleep transistor 720 (i.e., minimum static leakage) minimizes the discharge rate of the capacitor 715 and maximizes the time to discharge the capacitor 715.

At step 805, the CTRL signal is initialized to its minimum value. Setting the CTRL signal to its minimum value directs the negative voltage regulator 420 to drive the magnitude of the sleep signal SLPB 150 to its minimum value. At step 810, the controller switches the charging transistor 710 so that the capacitor 715 is charged to $V_{DD}$. At step 815, the charging transistor 710 is switched off so that the capacitor 715 may discharge through the emulated sleep transistor 720. At step 820, the reference voltage VREF is set to a constant voltage which is less than $V_{DD}$ (e.g. $V_{DD}/2$). At step 825, the comparator 730 generates an output to the counter 740 after the capacitor 715 discharges to VREF. The counter 740 determines a time required to discharge the capacitor 715 to VREF. The register 750 stores a count (i.e., time) of the counter 740.

At step 827, the CTRL signal is incremented by one bit. At step 830, the controller switches the charging transistor 710 so that the capacitor 715 is again charged to $V_{DD}$. At step 840, the charging transistor 710 is switched off. At step 860, the comparator 730 generates an output to the counter 740 after the capacitor 715 discharges to VREF. The counter 740 determines the time required to discharge the capacitor 715 with the new value of the CTRL signal and the corresponding SLPB signal.

At step 870, the state logic machine compares the value of the register 750 for the current pass through steps 830-860 (i.e., the time required to discharge the capacitor 715 to VREF for the new value of the CTRL signal and the SLPB signal) to the value of the register 750 for the previous pass through steps 830-860. If the value of the register 750 for the current pass did not decrease relative to the value of the register 750 for the previous pass, then the new value of the CTRL signal corresponds to a lower value of static leakage through the emulated sleep transistor 720. In this case, the method returns to step 827 to further increment the CTRL signal and measure the time required to discharge the capacitor 715. Alternatively, at step 870, if the time required to discharge the capacitor 715 decreased in the current pass, corresponding to a higher value of static leakage through the emulated sleep transistor 720, then the previously stored value of the register 750 corresponds to the lowest value of static leakage through the emulated sleep transistor 720. The value of the CTRL signal corresponding to minimal static leakage is used to control the negative voltage regulator 420 to generate the appropriate setting for the negative voltage 150.

One advantage of the embodiment of the digital ALC 410 of FIGS. 7-8 is that the CTRL signal comprises a digital signal. The digital CTRL signal may be routed via the control signal 140 to multiple leakage managers 130 of FIG. 1. For example, because silicon is an excellent thermal conductor, it may be advantageous to utilize a single digital ALC 410 with leakage managers 130 and power island managers 120. Each of the multiple power island managers 120 of this embodiment comprise the negative voltage regulator 420 and the charge pump 430, so that the functions of the leakage controller system 130 may be distributed as needed across the integrated circuit 100.

FIG. 9 is an illustration of the negative voltage regulator 420 of FIG. 4 for minimizing static leakage of the logic gate 115, in accordance with an example embodiment. The negative voltage regulator 420 includes an interface to receive the negative voltage 150, a first voltage divider 905, a second voltage divider 915, and a comparator 920. In one embodiment, the first voltage divider 905 comprises a series of stacked PMOS transistors (not shown) with bulk tied to source. It will be appreciated, for example, that a series of three equivalent stacked PMOS transistors with bulk tied to source provide a divide-by-3 voltage divider in the first voltage divider 905. It will further be appreciated that the first voltage divider 905 may comprise any ratio of division. The first voltage divider 905 provides a fixed voltage reference (e.g., point C) with respect to a positive voltage source (e.g., $V_{DD}$). The fixed voltage reference of this embodiment is coupled to a negative terminal of the comparator 920. Similarly, a series of three equivalent stacked PMOS transistors with bulk tied to source provide a divide-by-3 voltage divider in the fixed resistances of the second voltage divider 915. It will be appreciated that the second voltage divider 915 may comprise any ratio of division. The second voltage divider 915 of this embodiment is coupled to a positive terminal of the comparator 920.

In an embodiment in conjunction with the analog CTRL signal generated by the ALC 410 of FIG. 6, a variable resistor 910 of the second voltage divider 915 allows the second voltage divider 915 to generate a variable voltage reference (e.g., point D) depending on the negative voltage 150 and a received signal (CTRL) generated by the ALC 410. The variable resistor 910 may comprise a transistor circuit. Depending on the CTRL signal, the variable resistor 910 varies between high impedance and low impedance.

In conjunction with the digital ALC 410 of FIGS. 7-8, the variable resistor 910 of the second voltage divider 915 comprises a switched resistor network controlled by the digital CTRL signal. The variable resistor 910 of this embodiment may comprise two or more switched resistors. The variable resistor 910 may also comprise two or more PMOS transistors with bulk tied to source.

In operation, the negative voltage regulator 420 adjusts the negative voltage 150 depending on a comparison between the fixed voltage reference (point C) and the variable voltage reference (point D). The comparator 920 may generate an enable (EN) signal to enable the charge pump 430 (FIG. 4) to increase the magnitude of the negative voltage 150. If the EN signal is low, the alternating signal from the oscillator 425 (FIG. 4) to the charge pump 430 is disabled, preventing the charge pump 430 from increasing the magnitude of the negative voltage 150. If the EN signal is high, the alternating signal from the oscillator 425 is enabled so that the charge pump 430 will increase the magnitude of the negative voltage 150. Therefore, depending on the CTRL signal from the ALC 410, the comparator 920 will control the charge pump 430 to increase the magnitude of the negative voltage 150 or allow it to decrease.

Figure 10:
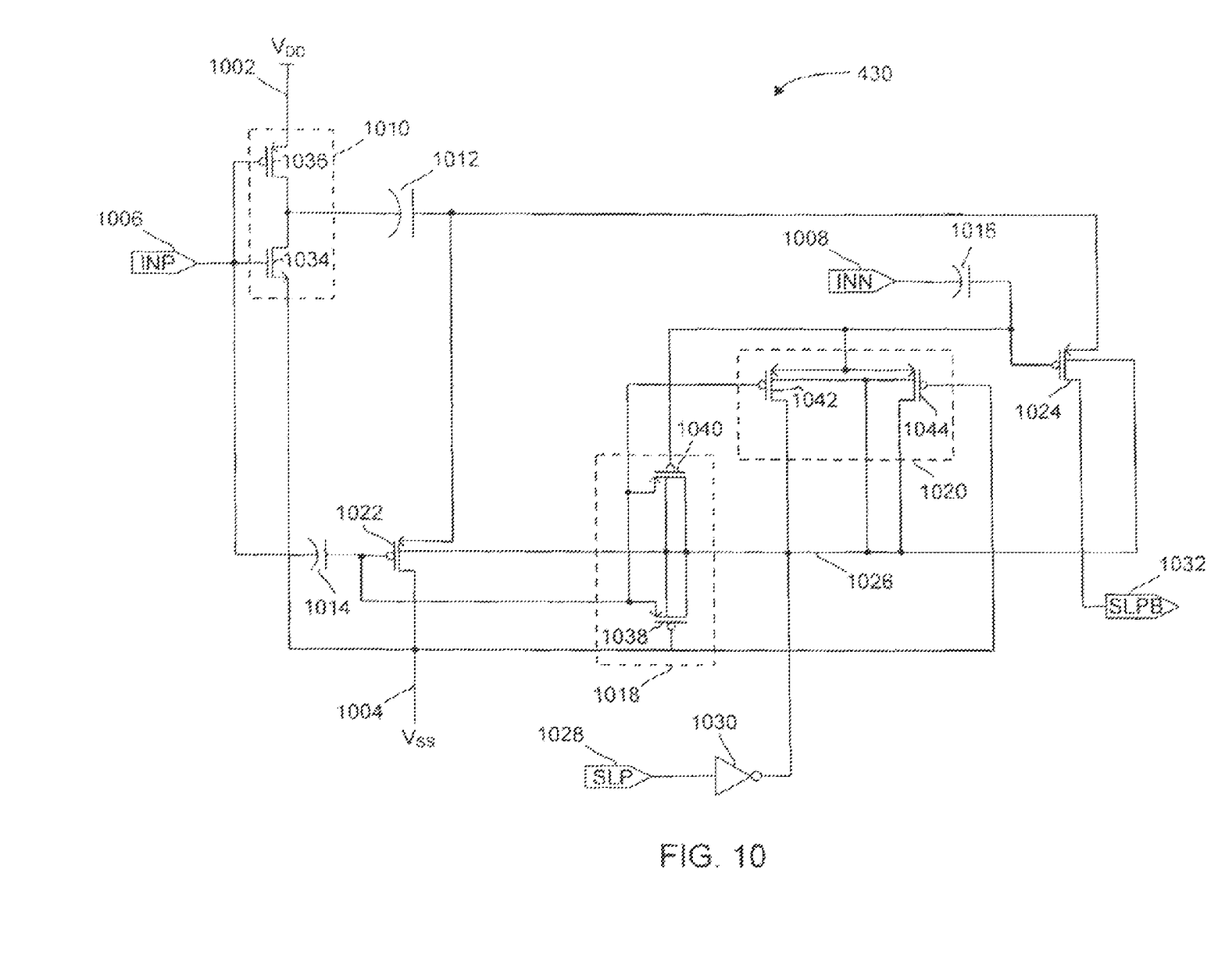
FIG. 10 is an illustration of the charge pump of FIG. 4 for minimizing static leakage, in accordance with one embodiment of the invention.

FIG. 10 is an illustration of the charge pump 430 of FIG. 4 for minimizing static leakage, in accordance with various embodiments of the invention. The charge pump 430 may receive and function to increase the magnitude of the SLPB signal 150 (as discussed in FIG. 4). The output of the charge pump 430 may be $V_{SS}$ (see FIG. 10) which, in various embodiments, functions as the SLPB signal 150 to be applied to the sleep transistor and/or the power island 110. The charge pump 430 may also receive alternating signals from the oscillator 425 as either the INP signal or the INN signal (in some embodiments, the INN signal is an inverted (i.e., a complement of the) INP signal). Further, the charge pump 430 may receive an EN signal (discussed in FIG. 4) which may enable and/or disable the charge pump 430. The EN signal may be received by the charge pump 430 as the SLP signal (see FIG. 10).

The charge pump 430 comprises two interfaces for voltage (e.g., $V_{DD}$ line 1002 and $V_{SS}$ line 1004), an input for an alternating signal (i.e., an INP line 1006), an input for an inverted alternating signal (i.e., an INN line 1008), an inverter 1010, a pump capacitor 1012, capacitances 1014 and 1016, a cross-coupled pass gate 1018 and 1020, PMOS transistors 1022 and 1024, node 1026, an SLP line 1028, an inverter 1030, and an SLPB line 1032. The cross-coupled pass gate 1018 may comprise two PMOS transistors 1038 and 1040. The cross-coupled pass gate 1020 may comprise two PMOS transistors 1042 and 11044. The inverter 1010 may comprise a NMOS transistor 1034 and a PMOS transistor 1036.

In example embodiments, the capacitance 1014 is electrically coupled to INP line 1006 and the capacitance 1016 is electrically coupled to the INN line 1008. The capacitance 1014 and 1016 may comprise a capacitor such as a metal-metal capacitor. In other embodiments, the capacitance 1014 and 1016 may comprise PMOS capacitances (e.g., varactors). Alternately, the capacitance 1014 and 1016 may comprise similar or different components. Those skilled in the art will appreciate that the capacitance 1014 and 1016 may be many different components comprising capacitances. In various embodiments, the capacitances 1014 and 1016 function to smooth out transients from the INP signals and the INN signals, respectively.

The gate of PMOS transistors 1022 and 1024 may be electrically coupled to the capacitance 1014 and 1016, respectively. The PMOS transistor 1022 and PMOS transistor 1024 may be electrically coupled to the pump capacitor 1012. The PMOS transistor 1022 may also be electrically coupled to the NMOS transistor 1034 within inverter 1010 as well as the $V_{SS}$ line 1004, the gate of the PMOS transistor 1038 in the cross coupled pass gate 1018, and the gate of the PMOS transistor 1044 in the cross coupled pass gate 1020. PMOS transistor 1024 may be coupled to SLPB line 1032. In various embodiments, the substrates of PMOS transistor 1022 and 1024 are electrically coupled to node 1026.

The output of the inverter 1010 is electrically coupled to the pump capacitor 1012. The drain of PMOS transistor 1036 is coupled to the source of NMOS transistor 1034 as well as the pump capacitor 1012. The INP line 1006 is electrically coupled to the gates of both the PMOS transistor 1036 and the NMOS transistor 1034 (e.g., the INP line 1006 is electrically coupled to the input of the inverter 1010).

The cross-coupled pass gate 1018 may comprise two PMOS transistors 1038 and 1040. In one example, the PMOS transistor 1038 is electrically coupled to the capacitance 1014, the gate of PMOS transistor 1022, the PMOS transistor 1040, and the gate of PMOS transistor 1042 in the cross-coupled pass gate 1020. The substrate and drain of PMOS transistor 1038 may be electrically coupled to the substrate and drain of the PMOS transistor 1040 as well as the node 1026. The gate of PMOS transistor 1040 is electrically coupled to the PMOS transistors 1042 and 1044 as well as the capacitance 1016 and the gate of PMOS transistor 1024.

The cross-coupled pass gate 1020 may comprise two PMOS transistors 1042 and 1044. In one example, the substrate of the PMOS transistor 1042 is electrically coupled to the substrate of PMOS transistor 1044 and the node 1026. The PMOS transistor 1042 and the PMOS transistor 1044 are electrically coupled to the node 1026.

The cross-coupled pass gate 1018 of this embodiment may be capacitively coupled to the alternating signal (the INP signal) from the oscillator 425 (FIG. 4). The cross-coupled pass gate 1020 may be capacitively coupled to a complement of the alternating signal (the INN signal) from the oscillator 425. The $V_{SS}$ (over the $V_{SS}$ line 1004) may supply negative voltage to the sleep transistor 210 to control the static leakage of the logic gate 115 of FIG. 2.

The $V_{DD}$ line 1002, $V_{SS}$ line 1004, INP line 1006, INN line 1008, and SLPB line 1032, and SLP line 1028 may comprise wires, traces, or any conductive material configured to function as an electrical medium. The INP line 1006 may be coupled with the oscillator 425 which may generate an alternating signal (i.e., the INP signal). The INN line 1008 may be coupled with an inverter configured to invert the alternating signal (i.e., the INP signal) to generate a complement of the alternating signal. It will be appreciated by those skilled in the art that, in some embodiments, the INN line 1008 receives an alternating signal and the INP line 1006 receives the complement of the alternating signal. There may be many ways to generate the alternating signal and/or the complement of the alternating signal.

Further, the SLPB line 1032 may receive the sleep signal from the leakage manager system 130. In various embodiments, the sleep signal is a negative voltage signal and the SLPB line 1032 is a negative voltage line. The SLP line 1028 may receive the SLP signal (e.g., the enable (EN) signal) from the negative voltage regulator 420. There may be many ways in which the SLP signal may be generated. Further, the SLP signal may be generated in such a way as to make the inversion of the signal either optional or unnecessary (i.e., the inverter 1030 may be optional).

In various embodiments, the alternating signal (INP signal) and the complement of the alternating signal (INN signal) may each comprise two states discussed herein including "high" and "low." Those skilled in the art will appreciate that the "high" signal is "high" when compared to the "low" state of the signal and is not "high" or "low" in comparison with another standard. In one example, the high state is 1 volt and the low state is 0 or −1 volts. As used herein, the high state is referred to as "high" and the low state is referred to as "low."

In various embodiments, when the INP signal is low (or goes low), the charge within the pump capacitor 1012 is released through the $V_{SS}$ signal (via $V_{SS}$ line 1004). In one example, the INP signal is received over the INP line 1006 by the gates of the inverter 1010 (i.e., the gate of the PMOS transistor 1036 and the gate of the NMOS transistor 1034). When the INP signal is low (or goes to low), the $V_{DD}$ signal may pass through from the source of the PMOS transistor 1036 to the pump capacitor 1012. Similarly, the INP signal is received by capacitance 1014 and, subsequently, the gate of PMOS transistor 1022. As a result, the charge of the pump capacitor 1012 may be released through the PMOS transistor 1022 and out through the $V_{SS}$ line 1004. The alternate of the INP signal, the INN signal, which is high (or goes to high), is coupled to the capacitance 1016 over the INN line 1008. The gate of PMOS transistor 1024 may receive the high signal from the capacitance 1016. As a result, the PMOS transistor 1024 may decouple the SLPB line 1032 from the pump capacitor 1012.

When the INP signal is high (or goes high), the pump capacitor 1012 is charged (i.e., the capacitor is charged by receiving the $V_{SS}$ signal and the SLPB signal). When the INP signal is high (or goes to high), the PMOS transistor 1036 no longer allows the pump capacitor 1012 to receive the $V_{DD}$ signal. The gate of NMOS transistor 1034 receives the INP signal over the INP line 1006 which subsequently allows the pump capacitor 1012 to receive the $V_{SS}$ signal from $V_{SS}$ line 1004 (the INP signal (i.e., high or going to high) is received by the gate of the PMOS transistor 1022 which prevents the $V_{SS}$ signal from flowing through the PMOS transistor 1022). The alternate of the INP signal, the INN signal (i.e., which is low or goes to low) is received by the gate of PMOS transistor 1024 which subsequently allows the SLPB signal (via the SLPB line 1032) to be received by the pump capacitor 1012 thereby allowing the pump capacitor 1012 to charge.

In some embodiments, the node 1026 is simply tied to ground. In other embodiments, the node 1026 is not tied to ground, but is coupled to the SLP signal. In one example, the SLP signal (via the SLP line 1028) is electrically coupled to the input of inverter 1060, the output of which is coupled to the node 1026. The inverter 1030 may be activated on exiting the sleep mode to prevent a power supply that generates $V_{DD}$ from being shorted to ground through the PMOS transistors 1022 and 1024, and may ensure that any P-N junctions in the wells are not forward biased.

In various embodiments, there is no current flow from the PMOS transistors to the substrate, since the substrate may be at an equal or higher potential than the source and drain of the PMOS transistors. In one example, current flow from the PMOS transistors to the substrate is avoided in order to compete against forward biased diodes for current flow. In another example, to ensure that no P-N junctions in the wells of the PMOS transistors are forward biased, the inverter 1030 may output a complement of the activated SLP signal to drive the node 1026 to 0 V.

The SLP signal may disable the charge pump 430. In one example, the SLP signal (e.g., the EN signal in FIG. 4) goes low. The node 1026 receives the SLP signal via the SLP line 1028 over the inverter 1030, and, as such, the node 1026 may receive a signal in a "high" state. The node 1026 electrically couples the high signal to the body of PMOS transistors 1022, 1038, 1040, 1042, 1044, and 1024. As a result, the PMOS transistors 1022, 1038, 1040, 1042, 1044, and 1024 do not allow current flow (e.g., are disabled) thereby disabling the charge pump 430.

Those skilled in art will appreciate that when either the INP signal or the INN signal is high (or goes to high), the signal may electrically couple to the node 1026, in various embodiments. In one example, the INP signal is high and the INN signal is low. The low signal (via the INN line 1008 and the capacitance 1016) is received at the gate of PMOS transistor 1040 which may allow the high INP signal to flow through the PMOS transistor 1040 to the node 1026. In another example, the INN signal is high and the INP signal is low. The low signal (via the INP line 1006 and the capacitance 1014) is received at the gate of PMOS transistor 1042 which may allow the high INN signal to flow through the PMOS transistor 1042 to the node 1026.

In various embodiments, the alternating connectivity of high signals with the node 1026 allows the high signal current to drain at ground when ground is coupled to node 1026. Alternatively, the alternating connectivity of high signals with the node 1026 may electrically couple with the SLP line 1028. In one example, the alternating high signals received by the body of PMOS transistors 1022, 1038, 1040, 1042, 1044, and 1024 (via node 1026) prevent leakage from the pump capacitor 1012 or prevents the $V_{DD}$ signal from coupling to ground. In another example, the alternating high signal over the node 1026 may reduce the voltage required by the SLP signal to sufficiently bias the bodies (i.e., substrates) of the PMOS transistors 1022, 1038, 1040, 1042, 1044, and 1024 in order to disable the charge pump 430.

While one skilled in the art should be able to implement and gain the benefits of the charge pump 430 if provided with only the circuits and diagrams of FIGS. 1-10, charging and discharging of the pump capacitor 1012 will now be described so that functional aspects of other example embodiments of the invention, that are clear from the drawings, may be explained in words that confirm what is shown in the drawings.

With reference to FIGS. 4 and 10, in some example embodiments, the INP signal becomes '0' and the INN signal becomes '1' in response to the rising edge of the oscillator 425. Due to the INP signal becoming '0', a voltage drop exists across the capacitance 1014, so the gate of the first PMOS transistor 1022 and the gate of the transistor 1042 is at '−1'. The cross-coupled pass gate 1020 is conducting while a negative voltage is applied at the gate of the transistor 1042. The first PMOS transistor 1022 is also conducting as the negative voltage is applied at the gate of the first PMOS transistor 1022. While the first PMOS transistor 1022 is on, the pump capacitor 1012 is discharging through the $V_{SS}$ line 1004.

Due to the INN signal becoming '1', there may be a positive voltage at the capacitance 1016 because this terminal receives the INN signal. With a '1' at the first terminal of the capacitance 1016, there is a '0' at the second terminal of the capacitance 1016. In various embodiments, the gate of the PMOS transistor 1040 and the second terminal of the capacitance 1016 share the same node, so the PMOS transistor 1040 is non-conducting because the gate-to-source voltage difference ($V_{GS}$) is greater than the threshold voltage ($V_T$). As a result, the cross-coupled pass gate 1018 is non-conducting during the discharging phase. Further, the PMOS transistor 1024 will be off during the discharging phase. As a result, charging of the pump capacitor 1012 does not occur during the discharging phase.

Next is the falling edge of the oscillator 425. In response, the INP signal may go from '0' to '1', and, consequently, the first and second terminals of the capacitance 1014 go from '0' and '1', respectively, to '−1' and '0', respectively. The cross-coupled pass gate 1020 becomes non-conducting because $V_{GS}$ of the transistor 1042 will rise above $V_T$ (i.e. the transistor 1042 will become non-conducting).

Also in response to the falling edge of the oscillator 425, the INN signal goes from '1' to '0', and consequently the first and second terminals of the capacitance 1016 go from '1' to '0' and '0' to '−1', respectively. So the node shared by the second terminal of the capacitance 1016, the gate of the second PMOS transistor 1024 and the gate of the PMOS transistor 1040 will be at '−1'. The cross-coupled pass gate 1018 will be conducting while a negative voltage is applied at the gate of the PMOS transistor 1040. The second PMOS transistor 1024 is also conducting during this period of time, as the negative voltage is also applied at the gate of the second PMOS transistor 1024. While the second PMOS transistor 1024 is on, the pump capacitor 1012 is charging. The PMOS transistor 1022 may be off during the above-described charging phase, so, in the illustrated example embodiment, discharging of the pump capacitor 1012 does not occur during the charging phase.

With reference now to FIGS. 4-10, it will be understood that the leakage manager system 130, comprising the adaptive leakage controller 410, the negative voltage regulator 420, and the charge pump 430, minimizes the static leakage of the logic gate 115, even if the static leakage varies due to effects such as temperature variation, voltage fluctuation, or manufacturing process variation. The leakage manager system 130 may be wholly integrated into the integrated circuit 100, obviating components external to the integrated circuit 100. Further, the leakage manager system 130 may advantageously be utilized in the integrated circuit 100 comprising single threshold transistor logic, simplifying manufacturing of the integrated circuit 100.

Modification of the previously described charge pump 430 to make it suitable for operation in different voltage ranges is contemplated. For example, a higher voltage (for instance, +2V) at the high end of the voltage operation range may be possible by customizing the circuit by switching the INN signal and the INP signal as well as using some bigger circuit components such as, for instance, bigger capacitors.

The components, type of components, and number of components identified in FIG. 10 are illustrative. For example, in some embodiments, the charge pump 430 may not comprise the PMOS transistor 1044 and the PMOS transistor 1038. Further, the inverter 1030 and SLP signal may be optional (e.g., the inverter 1030 and SLP signal may be replaced with a ground or a wire coupled to ground).

Further, the above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An integrated circuit comprising:
   a logic component, the logic component being either a logic gate or a storage cell, and the logic component including a sleep transistor in series with an electrical connection to a ground terminal;
   a voltage generator configured to generate a negative voltage to be applied to the sleep transistor; and
   controller circuitry configured to:
   i) monitor drain-source current of the sleep transistor;
   ii) make a determination of whether to adjust the negative voltage in connection with adequate minimization of a static leakage of the integrated circuit; and
   iii) adjust the negative voltage depending on the determination.

2. The integrated circuit of claim 1 wherein the controller circuitry is configured to continuously make determinations of whether to adjust the negative voltage in connection with the adequate minimization of the static leakage.

3. The integrated circuit of claim 1 wherein the controller circuitry is configured to periodically make determinations of whether to adjust the negative voltage in connection with the adequate minimization of the static leakage.

4. The integrated circuit of claim 1 wherein the voltage generator is configured to selectively generate the negative voltage.

5. The integrated circuit of claim 1 wherein the voltage generator is a charge pump.

6. An integrated circuit comprising:
   a logic component, the logic component being either a logic gate or a storage cell, and the logic component including a sleep transistor in series with an electrical connection to a ground terminal;
   a voltage generator configured to generate a negative voltage to be applied to the sleep transistor; and
   controller circuitry configured to:
   i) monitor a drain-source current and a drain-gate current of either the sleep transistor or an emulated sleep transistor;
   ii) make a determination of whether to adjust the negative voltage in connection with adequate minimization of a static leakage of the integrated circuit; and
   iii) adjust the negative voltage depending on the determination.

7. The integrated circuit of claim 6 wherein the controller circuitry is configured to continuously make determinations of whether to adjust the negative voltage in connection with the adequate minimization of the static leakage.

8. The integrated circuit of claim 6 wherein the controller circuitry is configured to periodically make determinations of whether to adjust the negative voltage in connection with the adequate minimization of the static leakage.

9. The integrated circuit of claim 6 wherein the voltage generator is configured to selectively generate the negative voltage.

10. The integrated circuit of claim 6 wherein the voltage generator is a charge pump.

11. An integrated circuit comprising:
    a logic component, the logic component being either a logic gate or a storage cell, and the logic component including a sleep transistor in series with an electrical connection to a ground terminal;
    a voltage generator configured to generate a negative voltage to be applied to the sleep transistor; and
    controller circuitry configured to:
    i) induce a current through an emulated sleep transistor in proportion to a static leakage of the integrated circuit;
    ii) make a determination of whether to adjust the negative voltage depending on the amount of the current; and
    iii) adjust the negative voltage depending on the determination.

12. The integrated circuit of claim 11 wherein the controller circuitry is configured to continuously make determinations of whether to adjust the negative voltage.

13. The integrated circuit of claim 11 wherein the controller circuitry is configured to periodically make determinations of whether to adjust the negative voltage.

14. The integrated circuit of claim 11 wherein the voltage generator is configured to selectively generate the negative voltage.

15. The integrated circuit of claim 11 wherein the voltage generator is a charge pump.

16. An integrated circuit comprising:
    a logic component, the logic component being either a logic gate or a storage cell, and the logic component including a sleep transistor in series with an electrical connection to a ground terminal;
    a voltage generator configured to generate a negative voltage to be applied to the sleep transistor; and
    a controller configured to receive the negative voltage and determine whether to adjust the negative voltage based on a comparison of a first current and a second current, the controller including:
    i) a first transistor configured to receive the negative voltage that defines the first current through the first transistor;

ii) a second transistor configured to receive the negative voltage plus an offset voltage that define the second current through the second transistor; and iii) circuitry configured to compare the first current to the second current.

17. The integrated circuit of claim 16 wherein the first and second transistors are emulated sleep transistors.

18. The integrated circuit of claim 17 wherein the voltage generator is configured to selectively generate the negative voltage.

19. The integrated circuit of claim 16 wherein the controller is configured to continuously determine whether to adjust the negative voltage.

20. The integrated circuit of claim 16 wherein the controller is configured to periodically determine whether to adjust the negative voltage.

21. The integrated circuit of claim 16 wherein the voltage generator is configured to selectively generate the negative voltage.

22. The integrated circuit of claim 21 wherein the voltage generator is a charge pump.

23. The integrated circuit of claim 16 wherein the voltage generator is a charge pump.

* * * * *